United States Patent
Nagai

(10) Patent No.: US 11,876,318 B2
(45) Date of Patent: Jan. 16, 2024

(54) ELECTRONIC DEVICE AND FLAT CABLE

(71) Applicant: Murata Manufacturing Co., Ltd., Nagaokakyo (JP)

(72) Inventor: Tomohiro Nagai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 358 days.

(21) Appl. No.: 17/320,281

(22) Filed: May 14, 2021

(65) Prior Publication Data

US 2021/0273361 A1    Sep. 2, 2021

Related U.S. Application Data

(63) Continuation of application No. PCT/JP2019/047979, filed on Dec. 9, 2019.

(30) Foreign Application Priority Data

Dec. 11, 2018 (JP) ................................. 2018-231460

(51) Int. Cl.
*H01R 12/79* (2011.01)
*H05K 1/14* (2006.01)

(52) U.S. Cl.
CPC ................ *H01R 12/79* (2013.01); *H05K 1/14* (2013.01)

(58) Field of Classification Search
CPC ..................................... H01R 12/79; H05K 1/14
USPC ....................................................... 439/541.5
See application file for complete search history.

(56) References Cited

U.S. PATENT DOCUMENTS

| | | | |
|---|---|---|---|
| 6,663,400 B1 | 12/2003 | Yokoyama | |
| 7,479,345 B2 * | 1/2009 | Nakamura | H01R 12/52 429/129 |
| 2003/0013013 A1 * | 1/2003 | Nakamura | H01R 12/52 361/784 |
| 2008/0009179 A1 * | 1/2008 | Tadokoro | H01R 12/675 439/493 |
| 2012/0138340 A1 | 6/2012 | Kato et al. | |
| 2012/0267143 A1 | 10/2012 | Sunaga et al. | |

FOREIGN PATENT DOCUMENTS

| | | | | |
|---|---|---|---|---|
| CN | 1348677 A * | 5/2002 | ........ | H01M 10/4257 |
| EP | 1091626 A1 * | 4/2001 | ........ | H01M 10/4257 |
| JP | 06-251834 A | 9/1994 | | |
| JP | H06251834 A * | 9/1994 | .......... | H05K 1/0393 |
| JP | 08-279667 A | 10/1996 | | |
| JP | 2001-102712 A | 4/2001 | | |
| JP | 2001-284760 A | 10/2001 | | |
| JP | 2009-038121 A | 2/2009 | | |
| JP | 2012-227037 A | 11/2012 | | |

(Continued)

OTHER PUBLICATIONS

Official Communication issued in International Patent Application No. PCT/JP2019/047979, dated Feb. 18, 2020.

*Primary Examiner* — Peter G Leigh
(74) *Attorney, Agent, or Firm* — Keating & Bennett, LLP

(57) ABSTRACT

An electronic device includes a circuit boards that have a same or substantially same shape, and flat cables that have a same or substantially same shape. The circuit boards are provided in a predetermined arrangement and are connected by the flat cables. Each of the flat cables is a semi-rigid cable, having a shape in accordance with the predetermined arrangement of the circuit boards.

26 Claims, 11 Drawing Sheets

(56) References Cited

FOREIGN PATENT DOCUMENTS

| | | | |
|---|---|---|---|
| JP | 2014-002226 A | 1/2014 | |
| JP | 2016-100495 A | 5/2016 | |
| JP | 2018-010910 A | 1/2018 | |
| WO | WO-0065888 A1 * | 11/2000 | ........ H01M 10/4257 |
| WO | 2011/018979 A1 | 2/2011 | |
| WO | WO-2018008624 A1 * | 1/2018 | ............... H05K 1/02 |
| WO | 2018/159839 A1 | 9/2018 | |

* cited by examiner

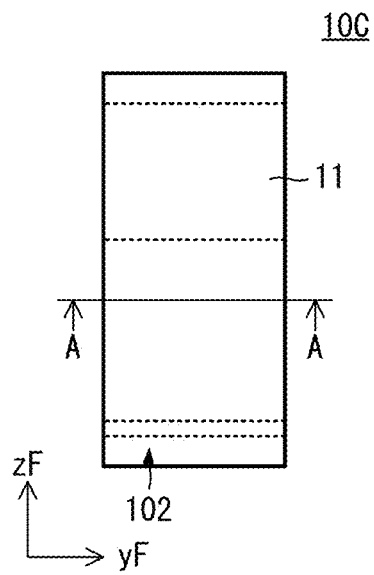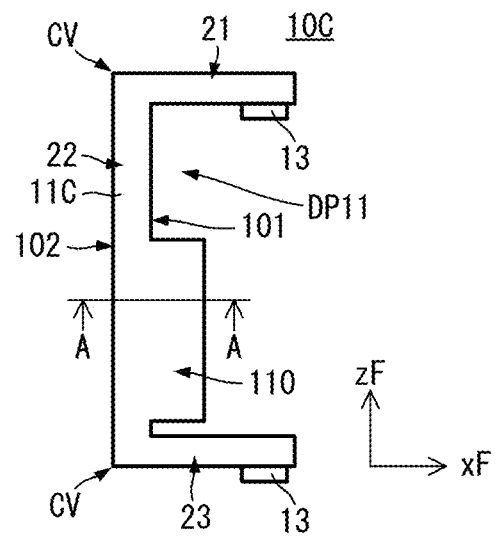
FIG.7A    FIG.7B
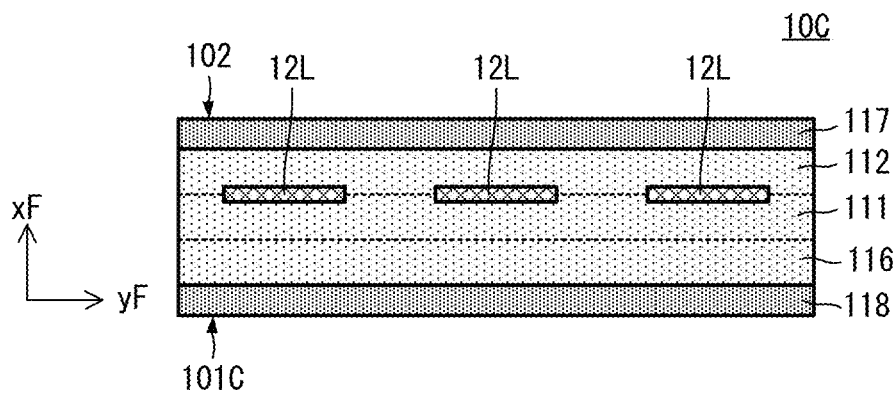
FIG.7C

ELECTRONIC DEVICE AND FLAT CABLE

CROSS REFERENCE TO RELATED APPLICATIONS

This application claims the benefit of priority to Japanese Patent Application No. 2018-231460 filed on Dec. 11, 2018 and is a Continuation Application of PCT Application No. PCT/JP2019/047979 filed on Dec. 9, 2019. The entire contents of each application are hereby incorporated herein by reference.

BACKGROUND OF THE INVENTION

1. Field of the Invention

The present invention relates to an electronic device that includes a plurality of circuit boards and a cable to connect the plurality of circuit boards to one another.

2. Description of the Related Art

JP 2014-2226A discloses an optical communication device that includes a plurality of circuit boards and a plurality of flexible boards. The plurality of circuit boards are connected by the flexible boards respectively.

As disclosed in an aspect of JP 2014-2226A where the plurality of circuit boards are used, three or more circuit boards are evenly spaced from one another in some cases. In this case, the three or more circuit boards are typically connected by flat cables of the same shape.

However, the flat cables typically used as in JP 2014-2226A are prone to being deformed. Thus, when connected to the plurality of circuit boards, the flat cables may be deformed in an unwanted direction. This results in a complication in connecting each of the flat cables to the corresponding circuit boards.

Such a problem is not limited to the flat cables, but may also arise in other cables (e.g., a coaxial cable) that are prone to be deformed.

SUMMARY OF THE INVENTION

Preferred embodiments of the present invention provide electronic devices and cables that each reduce or prevent complications in connecting a plurality of circuit boards by the cables.

An electronic device according to a preferred embodiment the present invention includes a plurality of circuit boards having a same or substantially same shape, and a plurality of flat cables having a same or substantially same shape. The plurality of circuit boards are arranged in a predetermined arrangement and are connected by the plurality of flat cables. Each of the plurality of flat cables is a semi-rigid cable, having a shape in accordance with the arrangement of the plurality of circuit boards.

When connected to the plurality of circuit boards arranged in the predetermined arrangement, each of the plurality of flat cables has a stable shape. Further, each of the flat cables is semi-rigid, and thus when connected, the corresponding flat cable is slightly deformed by an external force, so as to facilitate the connecting process.

The preferred embodiments of present invention provide electronic devices and cables that each significantly reduce or prevent complications in connecting a plurality of circuit boards by the cables.

The above and other elements, features, steps, characteristics, and advantages of the present invention will become more apparent from the following detailed description of the preferred embodiments with reference to the attached drawings.

BRIEF DESCRIPTION OF THE DRAWINGS

FIG. 7A is a first side view of the flat cable; FIG. 7B is a second side view of the flat cable; and FIG. 7C is an enlarged cross-sectional view of the flat cable, taken along line A-A in FIGS. 7A and 7B.

DETAILED DESCRIPTION OF THE PREFERRED EMBODIMENTS

First Preferred Embodiment

Figure 1:
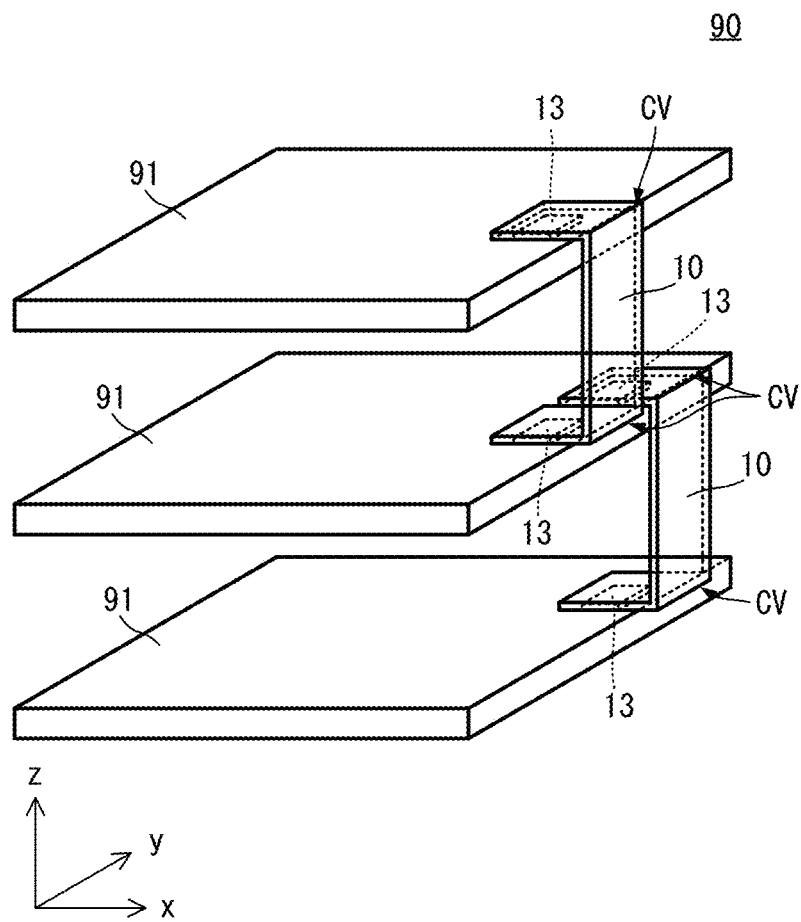
FIG. 1 is an external perspective view showing an electronic device according to a first preferred embodiment of the present invention.

An electronic device according to a first preferred embodiment of the present invention will be described with reference to the drawings. FIG. 1 is an external perspective view showing the electronic device according to the first preferred embodiment of the present invention.
Schematic Configuration of Electronic Device 90

As shown in FIG. 1, an electronic device 90 includes a plurality of flat cables 10 and a plurality of circuit boards 91.

Each of the plurality of circuit boards 91 (hereinafter, may be referred to simply as "circuit board(s) 91") has a flat plate shape, and has an external shape the same or substantially the same as the external shapes of the others of the circuit boards 91. In other words, the plurality of circuit boards 91 respectively have the same or substantially the same shape. Each of the circuit boards 91 has the same or substantially the same circuit element mounted thereon. Each of the circuit boards 91 includes an external connection connector at the same or substantially the same position on one main surface.

The circuit boards 91 are provided, for example, in a Z-axis direction and spaced away from one another, as shown in FIG. 1. The circuit boards 91 are evenly or substantially evenly spaced away from one another. Each of the circuit boards 91 includes the main surfaces parallel or substantially parallel to an X-axis direction and a Y-axis direction, each orthogonal or substantially orthogonal to the Z-axis direction. The main surfaces of the circuit boards 91 oppose one another.

The plurality of circuit boards 91 are respectively connected to one another by the plurality of flat cables 10 (hereinafter, may be referred to simply as "flat cable (s) 10"). More specifically, each of the flat cables 10 includes a plurality of connectors 13, and each of the plurality of connectors 13 is to be connected to the external connection connector of the corresponding circuit board 91. As a result, each of the flat cable 10 is connected to the corresponding circuit boards 91. Here, each of the flat cables 10 connects adjoining two circuit boards 91.

Shape of Flat Cable 10

Figure 2A:
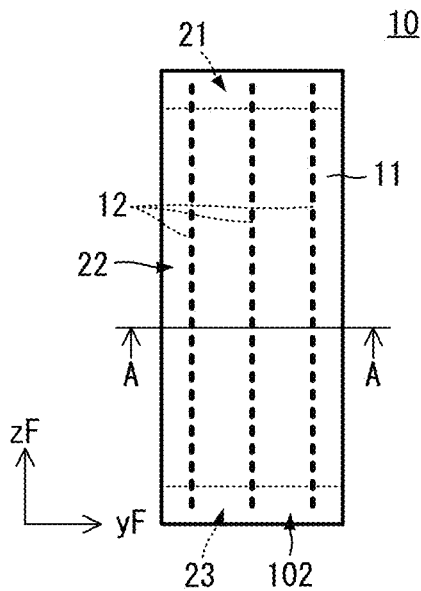
FIG. 2A is a first side view of a flat cable.
Figure 2B:
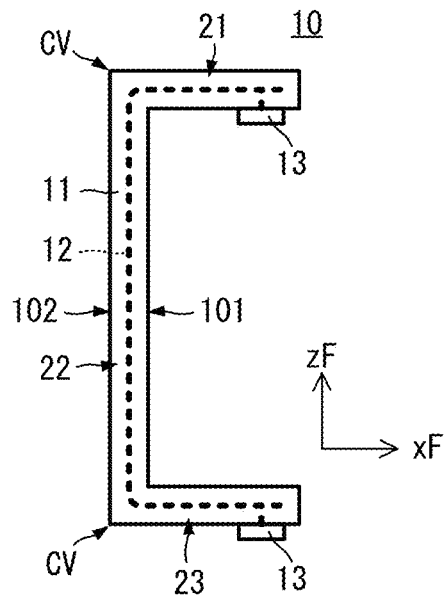
FIG. 2B is a second side view of the flat cable.
Figure 2C:
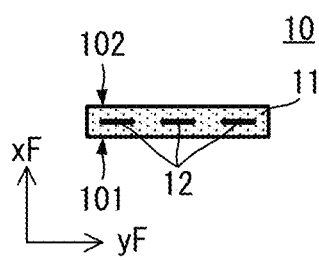
FIG. 2C is a cross-sectional view of the flat cable, taken along line A-A in FIG. 2A.
Figure 2D:
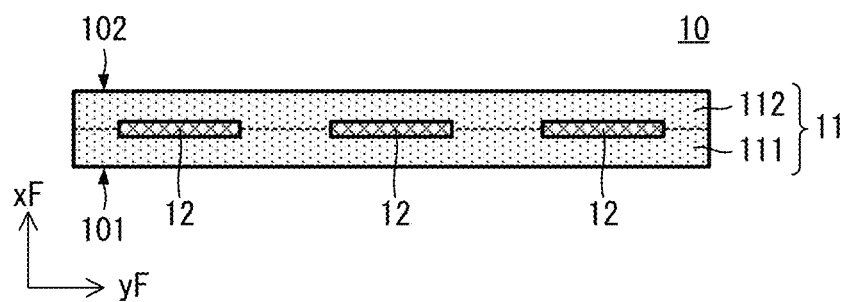
FIG. 2D is an enlarged cross-sectional view of the flat cable, taken along line A-A in FIG. 2A.
Figure 3:
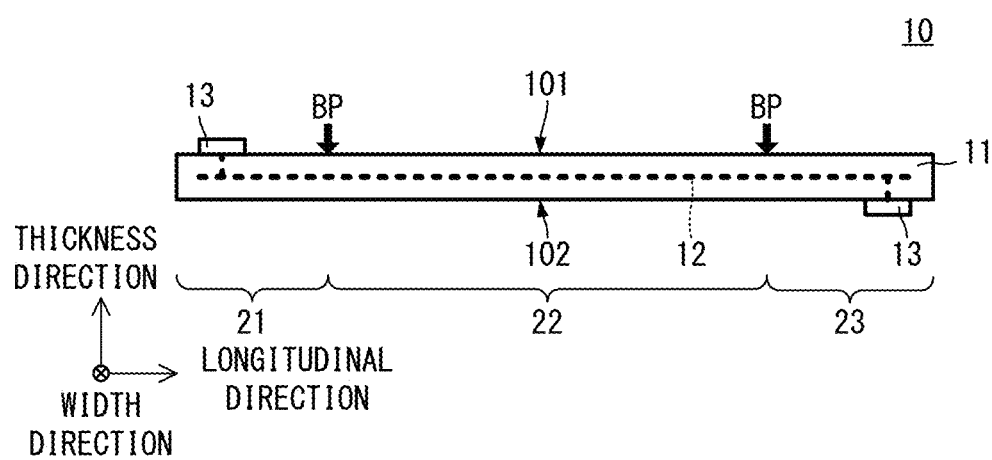
FIG. 3 is a side view of the flat cable before including a bent portion.

FIG. 2A is a first side view of a flat cable, and FIG. 2B is a second side view of the flat cable. FIG. 2C is a cross-sectional view of the flat cable, taken along line A-A in FIG. 2A, and FIG. 2D is an enlarged cross-sectional view of the flat cable, taken along line A-A in FIG. 2A. FIG. 3 is a side view of the flat cable before including a bent portion.

As shown in FIGS. 2A to 2D, and FIG. 3, each of the flat cables 10 includes a substrate 11, a plurality of signal conductors 12, and the plurality of connectors 13 (hereinafter, may be referred to simply as "connector(s) 13").

The substrate 11, having a plate shape or a film shape, includes a first main surface 101 and a second main surface 102. Here, the plate shape or the film shape corresponds to a shape having dimensions in two directions (that is, a longitudinal direction and a width direction) orthogonal or substantially orthogonal to a thickness direction, and the dimensions are significantly greater than a dimension in the thickness direction. The substrate 11 is greater in length in the longitudinal direction that is orthogonal or substantially orthogonal to the thickness direction, and is smaller in length in the width direction that is orthogonal or substantially orthogonal to the longitudinal direction and the thickness direction.

The substrate 11 includes an insulator layer 111 and an insulator layer 112. The insulator layer 111 and the insulator layer 112 are laminated in the thickness direction of the substrate 11. In other words, the substrate 11 is a laminated body of the insulator layer 111 and the insulator layer 112. Each of the insulator layer 111 and the insulator layer 112 is made of, for example, a thermoplastic material having a predetermined elastic modulus. Each of the insulator layer 111 and the insulator layer 112 is preferably made of the thermoplastic material that mainly includes, for example, a liquid crystal polymer or a fluororesin.

Each of the plurality of signal conductors 12 (hereinafter, may be referred to simply as "signal conductor(s) 12") is a linear conductor, and has a shape extending in the longitudinal direction of the substrate 11. The signal conductors 12 are spaced away from one another in the width direction of the substrate 11.

As shown in FIG. 2C, each of the signal conductors 12 is located at a middle position of the substrate 11 in the thickness direction of the substrate 11. For example, as shown in FIG. 2D, the signal conductors 12 are located adjacent to or in a vicinity of an abutting surface between the insulator layer 111 and the insulator layer 112. Each of the signal conductors 12 is made of a material that has high conductivity and that is less prone to be broken by being curved or bent. Each of the signal conductors 12 is preferably made of the material that mainly includes, for example, a copper (Cu).

Each of the connectors 13 is provided at both ends of the substrate 11 in the longitudinal direction of the substrate 11. At one end, the corresponding connector 13 is provided on the first main surface 101 of the substrate 11. At the other end, the corresponding connector 13 is provided on the second main surface 102 of the substrate 11. The connector 13 at the one end is connected to one ends of the signal conductors 12 in an extending direction of the signal conductors 12. The connector 13 at the other end is connected to the other ends of the signal conductors 12 in the extending direction of the signal conductors 12.

Here, each of the connectors 13 is to be fitted to the connector of the corresponding circuit board in a direction of top to bottom, but is not limited thereto. Alternatively, each of the connectors 13 may be slid in the lateral direction to be inserted and fitted into the connector of the corresponding circuit boards. Accordingly, even when the circuit boards are disposed at a limited distance from one another, each of the flat cables is easily connected to the corresponding circuit boards. As a result, the circuit boards are easily connected to one another. Further, in this example, the connectors are used to connect the circuit boards to one another, but the connectors are not necessarily required. Accordingly, regardless of a thickness of each of the connectors, the circuit boards may be located closer to one another. However, when the circuit boards are required to be strongly connected to one another, the connectors are preferably included.

Accordingly, the substrate 11 includes a first section 21, a second section 22, and a third section 23 in the longitudinal direction of the substrate 11. The first section 21 includes a first end of the substrate 11 in the longitudinal direction of the substrate, and the third section 23 includes a second end of the substrate 11 in the longitudinal direction of the substrate 11. The second section 22 is located between the first section 21 and the third section 23, connecting the first section 21 and the third section 23, in the longitudinal direction of the substrate 11. Here, each of the first section 21 and the third section 23 corresponds to a "connection section", and the second section 22 corresponds to a "linear section". In other words, in a case of FIG. 1, the connection section corresponds to areas of each of the flat cables 10 that overlap surfaces of the corresponding circuit boards 91, and the linear section corresponds to the other areas of each of the flat cables 10 that does not overlap surfaces of the corresponding circuit boards 91.

The first section 21 and the third section 23 have lengths that are equal or substantially equal to each other, and each of the lengths is equal or substantially equal to a distance between the external connection connector of each of the circuit boards 91 and a side surface of the corresponding circuit board 91. The second section 22 has a length equal for substantially equal to a distance at which the circuit boards 91 are located from one another.

As shown in FIGS. 2A, 2B, 2C, and 2D, the substrate 11 and the signal conductors 12 include, in the longitudinal directions thereof, a bent portion CV in an area where the first section 21 and the second section 22 are connected. At the bent portion CV, main surfaces of the first section 21 are orthogonal or substantially orthogonal to main surfaces of the second section 22. Concurrently, the substrate 11 and the signal conductors 12 include, in the longitudinal directions thereof, a bent portion CV in an area where the second section 22 and the third section 23 are connected. At the bent portion CV, the main surfaces of the second section 22 are orthogonal to main surfaces of the third section 23. Each of the bent portions CV does not necessarily have a right angle shape, and may have a curved shape or the like, for example. However, when having substantially the right angle shape, each of the bent portions CV maintains a three-dimensional shape more easily and thus remains in a stable shape.

More specifically, each of the first section 21 and the third section 23 has a longitudinal direction that is parallel or substantially parallel to an xF direction of the flat cable 10. Each of the first section 21 and the third section 23 has a width direction that is parallel or substantially parallel to a yF direction of the flat cable 10. Each of the first section 21 and the third section 23 has a thickness direction that is parallel or substantially parallel to a zF direction of the flat cable 10. The second section 22 has a longitudinal direction that is parallel or substantially parallel to the zF direction of the flat cable 10. The second section 22 has a width direction that is parallel or substantially parallel to the yF direction of the flat cable 10. The second section 22 has a thickness direction that is parallel or substantially parallel to the xF direction of the flat cable 10.

As shown in FIG. 2B, the first section 21 and the third section 23 extend in the same direction or substantially the same direction with respect to the second section 22.

Accordingly, the connector 13 in the first section 21 is located at a side closer to the second section 22, and the connector 13 in the third section 23 is located at an opposite side of the second section 22.

With the flat cables 10 each having a shape as shown in FIG. 1, even when each of the circuit boards 91 has the external connection connector provided thereon, the circuit boards 91 are easily connected to one another by the flat cables 10.

Further, with the substrate 11 made of the material as described above, each of the flat cables 10 defines and functions as a semi-rigid cable. A semi-rigid item is deformed relatively easily by an external force, while maintaining the three-dimensional shape when the external force is absent.

Being semi-rigid, each of the flat cables 10 is easily connected to the corresponding circuit boards 91 provided as described above. More specifically, for example, when one of the connectors 13 is connected to one of the adjoining two circuit boards 91 (hereinafter, may be referred to simply as "one circuit board 91") while the shape of the flat cable 10 is maintained, the other of the connectors 13 is to be positioned closer to the connection section of the other of the adjoining two circuit boards 91 (hereinafter, may be referred to simply as "the other circuit board 91"). As has been described above, when the one of the connectors 13 is connected to the one circuit board 91, the other of the connectors 13 is to be positioned closer to the other circuit board 91, and additionally, each of the flat cables 10 is flexible, in other words, is easily curved. As a result, the other of the connectors 13 is to be easily connected to the other circuit board 91.

Further, as has been described above, in each of the flat cables 10, the first section 21, the second section 22, and the third section 23 of the substrate 11 have dimensions based on the external shape of the circuit boards 91 and based on the distance at which the circuit boards 91 are located from one another. Accordingly, the plurality of circuit boards 91 are more easily connected to one another by the flat cables 10.

Accordingly, complications in connecting the circuit boards 91 by the flat cables 10 are significantly reduced or prevented.

Manufacturing Method for Flat Cable 10

Figure 4:
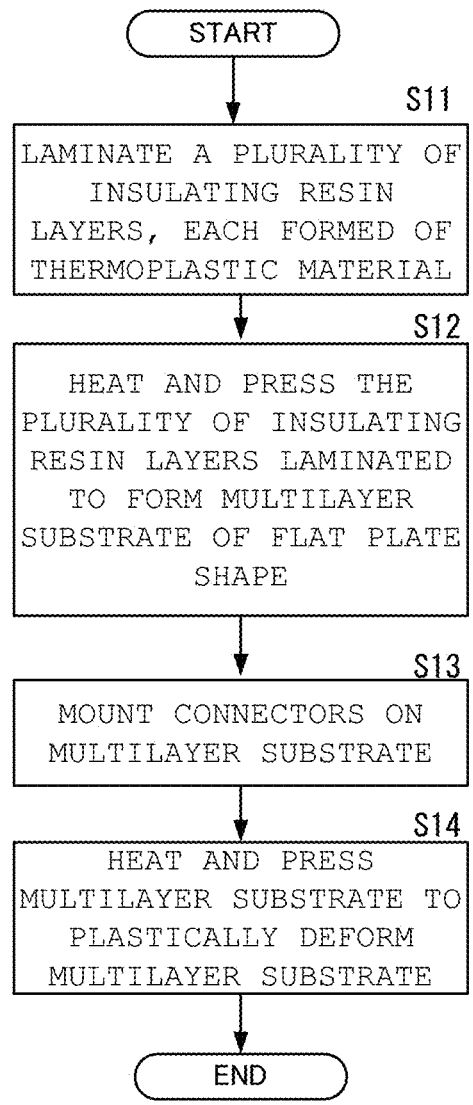
FIG. 4 is a flowchart showing a first manufacturing method for the flat cable.

FIG. 4 is a flowchart showing a first non-limiting example of a manufacturing method for the flat cable. As shown in FIG. 4, first, a plurality of insulating resin layers (corresponding to, in a case of FIG. 2D for example, the insulator layer 111 and the insulator layer 112), each made of the thermoplastic material, are laminated on each other (S11). In this state, the signal conductors 12 are located on one of the plurality of insulating resin layers predetermined.

Next, the laminated body is heated and pressed to form a multilayer substrate (that is, the substrate 11 before being plastically deformed) having a flat plate shape (S12) as shown in FIG. 3. Then, the multilayer substrate having the flat plate shape includes the connectors 13 mounted thereon (S13).

Next, in the longitudinal direction of the multilayer substrate of flat plate shape, each of a boundary BP (between the first section 21 and the second section 22) and a boundary BP (between the second section 22 and the third section 23) is abutted by a member having a corner or the like. In this state, the multilayer substrate is further heated and pressed to plastically deform the multilayer substrate at the boundaries BP (S14). As a result, the multilayer substrate includes the bent portions CV formed at the boundary BP (between the first section 21 and the second section 22) and at the boundary BP (between the second section 22 and the third section 23). Step S13 and step S14 may be reversed.

In the state described above, the flat cable 10 is cooled down, and the flat cable 10, as a semi-rigid cable including the bent portion CV in the maintained shape, is formed.

Second Embodiment

Figure 5:
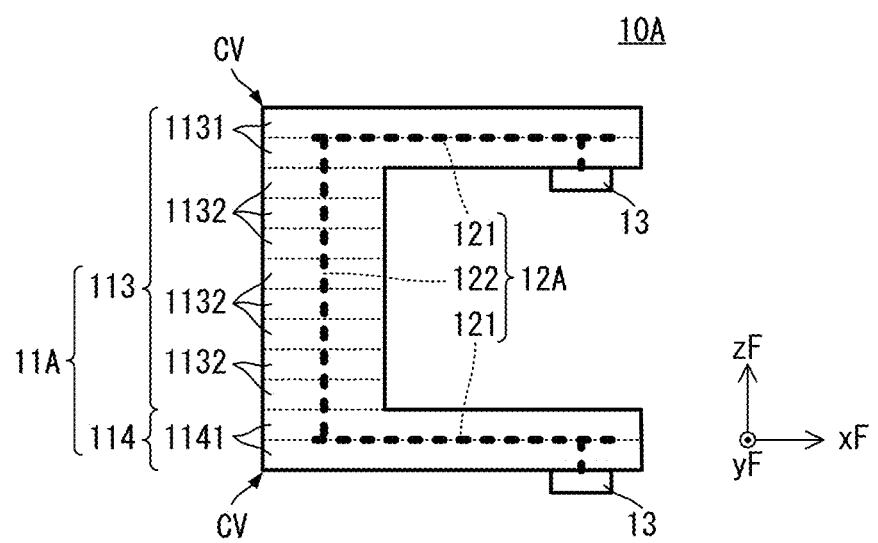
FIG. 5 is a side view showing a flat cable according to a second preferred embodiment of the present invention.

A flat cable of an electronic device in the electronic device, according to a second preferred embodiment of the present invention, will be described with reference to the drawings. FIG. 5 is a side view showing the flat cable according to the second preferred embodiment of the present invention.

As shown in FIG. 5, a flat cable 10A according to the second preferred embodiment has an external shape that is the same or substantially the same as that of the flat cable 10 according to the first preferred embodiment, and the flat cable 10A includes a substrate 11A and a signal conductor 12A that are different from the flat cable 10 according to the first preferred embodiment. Other features in the flat cable 10A, a plurality of circuit boards 91 (hereinafter, may be referred to simply as "circuit boards 91"), and connection of the flat cable 10A to each of the circuit boards 91 are the same as or similar to those in the first preferred embodiment, and thus a detailed description thereof will be omitted.

The substrate 11A includes a plurality of insulator layers 1131, a plurality of insulator layers 1132, and a plurality of insulator layers 1141. (Hereinafter, the plurality of insulator layers 1131 may be referred to simply as "insulator layers 1131", the plurality of insulator layers 1132 may be referred to simply as "insulator layers 1132", and the plurality of insulator layers 1141 may be referred to simply as "insulator layers 1141".) In an example of FIG. 5, for example, the number of layers of the insulator layers 1131 is two, the number of the insulator layers 1132 is eight, and the number of the insulator layers 1141 is two. Here, the insulator layers 1131 and insulator layers 1141 correspond to a "first insulator layer", and the insulator layers 1132 correspond to a "second insulator layer".

The insulator layers 1131 and the insulator layers 1141 have lengths (each corresponding to a "first length") in an xF direction (corresponding to a "specific direction"), and the lengths are equal or substantially equal to one another. Concurrently, the lengths are greater than lengths (each corresponding to a "second length") that the insulator layers 1132 have in the xF direction. The insulator layers 1131, the insulator layers 1132, and the insulator layers 1141 all have equal or substantially equal lengths in a yF direction.

The insulator layers 1131, the insulator layers 1132, and the insulator layers 1141 are all laminated in a zF direction. In this state, the insulator layers 1132 are sandwiched between the insulator layers 1131 and the insulator layers 1141. Concurrently, the insulator layers 1131, the insulator layers 1132, and the insulator layers 1141 are laminated, having one ends thereof aligned in the xF direction.

Accordingly, similar to the flat cable 10, the flat cable 10A has an external shape that includes, in a middle of its longitudinal direction, two bent portions CV.

The flat cable 10A is manufactured by, for example, a method as follows. The insulator layers 1131 and the insulator layers 1132 are laminated to define a first laminated body 113. In this state, the insulator layers 1131 include, on an abutting surface thereof, a linear conductor 121 extending in the xF direction. Concurrently, on each of the insulator layers 1132, an interlayer connection conductor 122 is located. The interlayer connection conductor 122 is, for example, a through hole filled with conductive paste. In the first laminated body 113, the interlayer connection conductor 122 is connected to the linear conductor 121.

Further, the insulator layers 1141 are laminated to define a second laminated body 114. In this state, the insulator layers 1141 include, on an abutting surface thereof, a linear conductor 121 extending in the xF direction. Further, in an area of the insulator layers 1141 located adjacent to or in a vicinity of a side where insulator layers 1141 connected to the first laminated body 113 with respect to the linear conductor 121 in the zF direction, the interlayer connection conductor 122 including the through hole filled with conductive paste is located. In the second laminated body 114, the interlayer connection conductor 122 is connected to the linear conductor 121.

Next, the first laminated body 113 and the second laminated body 114 are laminated and partially heat-pressed and bonded. In other words, an area, where all of the insulator layers 1131, the insulator layers 1132, and the insulator layers 1141 are laminated, is heat-pressed and bonded. As a result, the first laminated body 113 and the second laminated body 114 are joined or bonded to each other. Further, the interlayer connection conductor 122 of the first laminated body 113 and the interlayer connection conductor 122 of the second laminated body 114 are joined to each other, to provide the signal conductor 12A.

With the features, the structures, and the manufacturing method described above, unlike in the first preferred embodiment where the bending is included, the flat cable 10A is manufactured without being plastically deformed.

Further, a distance between the two connectors 13 in the zF direction is set by the number of layers of the insulator layers 1132. Accordingly, the distance between the connectors 13 may be set in accordance with a thickness of each of the corresponding circuit boards 91 or a distance at which the circuit boards 91 are located from one another.

Third Embodiment

Figure 6:
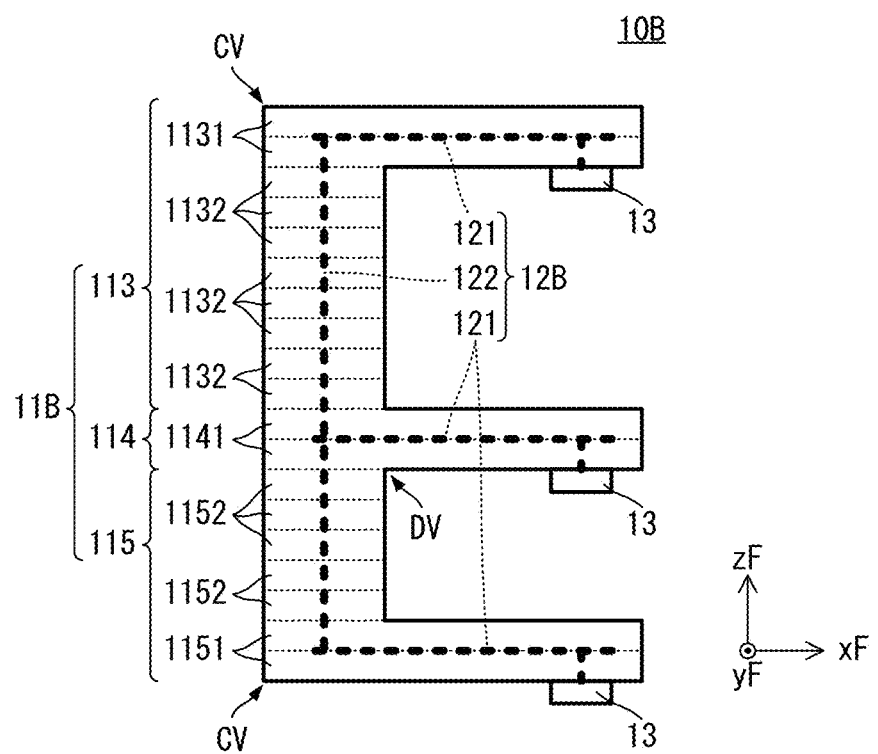
FIG. 6 is a side view showing a flat cable according to a third preferred embodiment of the present invention.

A flat cable of an electronic device according to a third preferred embodiment of the present invention, will be described with reference to the drawings. FIG. 6 is a side view showing the flat cable according to the third preferred embodiment of the present invention.

As shown in FIG. 6, unlike the flat cable 10A according to the second preferred embodiment, a flat cable 10B according to the third preferred embodiment additionally includes a long section extending in an xF direction. Other features of the flat cable 10B are the same as or similar to those of the flat cable 10A according to the second preferred embodiment, and thus a detailed description thereof will be omitted.

The flat cable 10B includes a substrate 11B. The substrate 11B includes a plurality of insulator layers 1131, a plurality of insulator layers 1132, a plurality of insulator layers 1141, a plurality of insulator layers 1151, and a plurality of insulator layers 1152. (Hereinafter, the plurality of insulator layers 1131 may be referred to simply as "insulator layers 1131", the plurality of insulator layers 1132 may be referred to simply as "insulator layers 1132", the plurality of insulator layers 1141 may be referred to simply as "insulator layers 1141", the plurality of insulator layers 1151 may be referred to simply as "insulator layers 1151", and the plurality of insulator layer 1152 may be referred to simply as "insulator layers 1152".) In an example of FIG. 6, the number of layers of the insulator layers 1131 is two, the number of layers of the insulator layers 1132 is eight, the number of layers of the insulator layers 1141 is two, the number of layers of the insulator layers 1151 is two, and the number of layers of the insulator layers 1152 is five.

The insulator layers 1131, the insulator layers 1141, and the insulator layers 1151 have lengths in the xF direction, and the lengths are equal or substantially equal to one another. Concurrently, the lengths are greater than the lengths that the insulator layers 1132 have in the xF direction. The insulator layers 1152 have lengths in the xF direction, the length equal or substantially equal to the lengths that the insulator layers 1132 have in the xF direction. The insulator layers 1131, the insulator layers 1132, the insulator layers 1141, the insulator layers 1151, and the insulator layers 1152 have equal or substantially equal lengths in a yF direction.

The insulator layers 1131, the insulator layers 1132, the insulator layers 1141, the insulator layers 1151, and the insulator layers 1152 are laminated in a zF direction. In this state, the insulator layers 1132 are sandwiched between the insulator layers 1131 and the insulator layers 1141. The insulator layers 1152 are sandwiched between the insulator layers 1141 and the insulator layers 1151.

Concurrently, the insulator layers 1131, the insulator layers 1132, the insulator layers 1141, the insulator layers 1151, and the insulator layers 1152 are laminated, having one ends thereof aligned in the xF direction.

Accordingly, the flat cable 10B has an external shape that includes, in a middle of its longitudinal direction, two bent portions CV, and that includes a branch DV in a middle between the two bent portions CV. Thus, with one single flat cable 10B, three circuit boards 91 are able to be connected. However, the number of the branches may be increased, and four or more circuit boards 91 are able to be connected by one single flat cable.

The flat cable 10B is manufactured by, for example, a method as follows. The method is similar to that of the flat cable 10A until each of a first laminated body 113 and a second laminated body 114 is provided.

The insulator layers 1151 and the insulator layers 1152 are laminated to form a third laminated body 115. In this state, the insulator layers 1151 include, on an abutting surface thereof, a linear conductor 121 extending in the xF direction. Concurrently, on each of the insulator layers 1152, an interlayer connection conductor 122 is located. The interlayer connection conductor 122 is, for example, a through hole filled with conductive paste. In the third laminated body 115, the interlayer connection conductor 122 is connected to the linear conductor 121.

Next, the first laminated body 113, the second laminated body 114, and the third laminated body 115 are laminated and partially heat-pressed and bonded. In other words, an area, where all of the insulator layers 1131, the insulator layers 1132, the insulator layers 1141, the insulator layers 1151, and the insulator layers 1152 are laminated, is heat-pressed and bonded. As a result, the first laminated body 113, the second laminated body 114, and the third laminated body 115 are joined or bonded to one another. The interlayer connection conductor 122 of the first laminated body 113 and the interlayer connection conductor 122 of the second laminated body 114 are joined to each other, and the interlayer connection conductor 122 of the second laminated body 114 and the interlayer connection conductor 122 of the third laminated body 115 are joined to each other, and a signal conductor 12B is formed.

Fourth Embodiment

A flat cable of an electronic device according to a fourth preferred embodiment of the present invention, will be described with reference to the drawings. FIG. 7A is a first side view of the flat cable, and FIG. 7B is a second side view of the flat cable. FIG. 7C is an enlarged cross-sectional view of the flat cable, taken along line A-A in FIGS. 7A and 7B.

As shown in FIGS. 7A, 7B, and 7C, unlike the flat cable 10 according to the first preferred embodiment, a flat cable 10C according to the fourth preferred embodiment includes a circuit function unit 110. Other features of the flat cable 10C are similar to those of the flat cable 10, and thus a detailed description thereof will be omitted.

The flat cable 10C includes a substrate 11C, and the substrate 11C has a second section 22 where a circuit function unit 110 is located. As shown in FIG. 7C, the circuit function unit 110 includes a plurality of inductor conductors 12L. The plurality of inductor conductors 12L (hereinafter, may be referred to simply as "inductor conductor(s) 12L") partially define and function as the signal conductors 12. The inductor conductors 12L are parallel or substantially parallel to and spaced away from one another. Here, the inductor conductors 12L are provided parallel or substantially parallel to one another, thus removing noise overlapping signals from the signal conductors 12. In other words, the circuit function unit 110 defines and functions as a noise removal circuit.

The circuit function unit 110 includes an insulator layer 111, an insulator layer 112, an insulator layer 116, an insulator layer 117, and an insulator layer 118, all of which are laminated. The insulator layer 111, the insulator layer 112, and the insulator layer 116 are sandwiched between the insulator layer 117 and the insulator layer 118.

With regard to the circuit function unit 110, in the insulator layer 111, the insulator layer 112, and the insulator layer 116, a magnetic filler is not included, and in the insulator layer 117 and the insulator layer 118, the magnetic filler is included. Here, the insulator layers, each including the magnetic filler, have the inductor conductors 12L sandwiched therebetween, and the inductor conductors 12L are increasingly coupled to one another. As a result, the inductor conductors 12L more effectively remove the noise.

As shown in FIG. 7B, the circuit function unit 110 is greater in thickness than other areas of the second section 22. Accordingly, the circuit function unit 110 is less prone to being deformed, and a characteristic change of the circuit function unit 110 caused by deformation thereof is less likely to occur.

As shown in FIG. 7B, in the second section 22, the circuit function unit 110 includes a projecting portion that projects from an inner surface of the second section 22 (that is, a surface from which a first section 21 and a third section 23 project) beyond a first main surface 101. The projecting portion is located in a space between the first section 21 and the third section 23. Accordingly, the flat cable 10C includes a recessed portion DP11 provided adjacent to or in a vicinity of the first main surface 101. Concurrently, in the second section 22, the circuit function unit 110 has its second main surface 102 aligned with second main surfaces 102 of the other areas. The features described above provide advantageous effects as will be described below.

Figure 8:
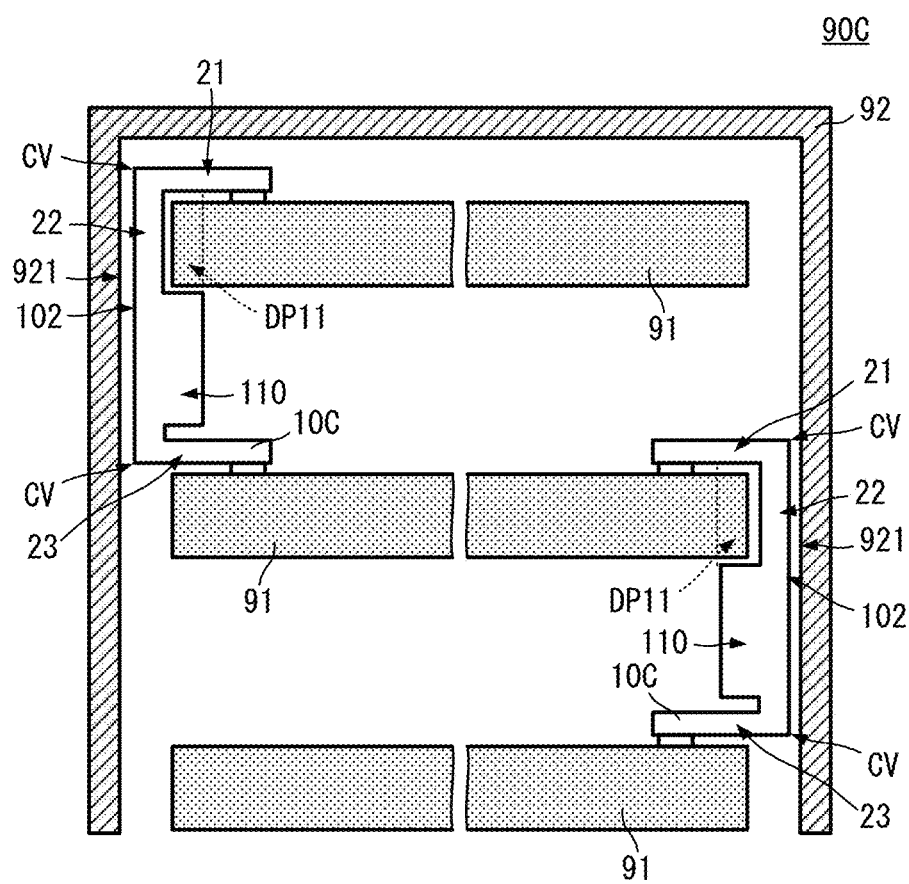
FIG. 8 is a cross-sectional side view showing an example of an electronic device according to a fourth preferred embodiment of the present invention.

FIG. 8 is a cross-sectional side view showing an example of the electronic device according to the fourth preferred embodiment of the present invention. As shown in FIG. 8, an electronic device 90C includes a plurality of circuit boards 91, a plurality of the flat cables 10C, and a housing 92.

Similar to the first preferred embodiment previously described, the plurality of circuit boards 91 are spaced away from one another, and include flat shape surfaces thereof opposing one another.

Each of the plurality of flat cables 10C (hereinafter, may be referred to simply as "flat cable(s) 10C") connects adjoining two of the plurality of circuit boards 91. In this state, one of the adjoining two of the plurality of circuit boards 91 (hereinafter, may be referred to simply as "one circuit board 91"), to which the first section 21 of the corresponding flat cable 10C is connected, is located inside the recessed portion DP11 of the corresponding flat cable 10C. Here, the one circuit board 91 has an external shape the same or substantially the same as that of the recessed portion DP11. The features described above facilitate positioning of the corresponding flat cable 10C when connecting the corresponding flat cable 10C to the one circuit board 91. Then, the corresponding flat cable 10C is easily connected to the one circuit board 91.

Further, with the features and structures described above, even when the circuit function unit 110 is thicker than the other areas, the second main surface 102 of the circuit function unit 110 does not project outward. Thus, unwanted space between an inner wall surface 921 of the housing 92 and the flat cable 10C is able to be decreased. Accordingly, the housing 92 may be reduced in size.

Fifth Preferred Embodiment

Figure 9:
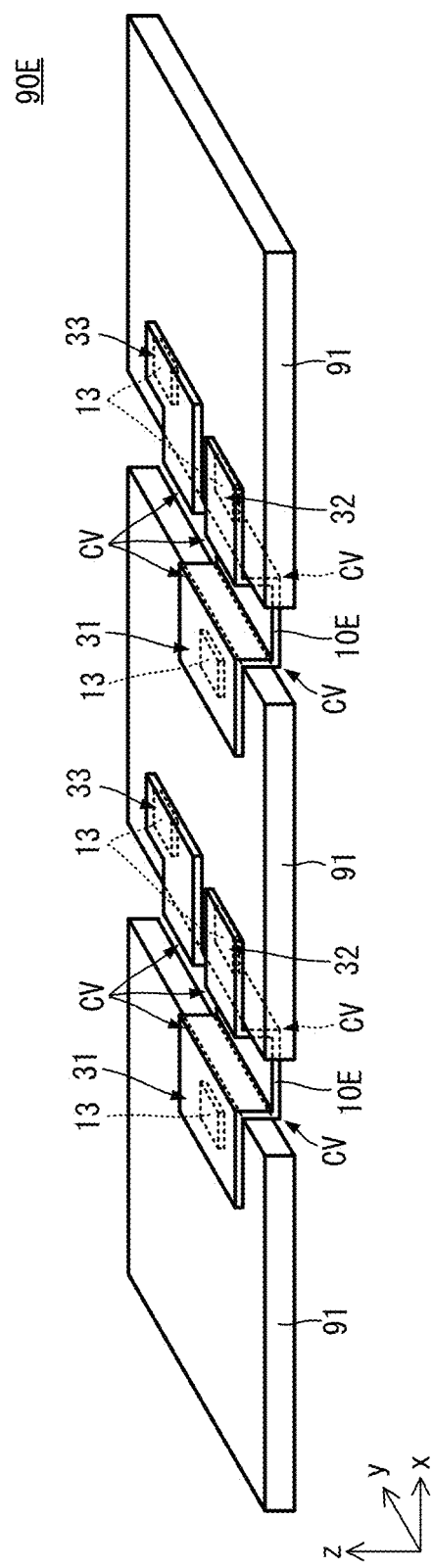
FIG. 9 is an external perspective view showing an electronic device according to a fifth preferred embodiment of the present invention.

A flat cable of the electronic device according to a fifth preferred embodiment of the present invention, will be described with reference to the drawings. FIG. 9 is an external perspective view showing the electronic device according to the fifth preferred embodiment of the present invention.

As shown in FIG. 9, an electronic device 90E according to the fifth preferred embodiment includes a plurality of circuit boards 91 provided in a direction different from that in the electronic device 90 according to the first preferred embodiment, and includes a plurality of flat cables 10E, each having a shape different from that in the electronic device 90 according to the first preferred embodiment. Other features in the electronic device 90E are the same as or similar to those in the electronic device 90, and thus a detailed description thereof will be omitted.

The plurality of circuit boards 91 are provided in a direction parallel or substantially parallel to the main surfaces (that is, an X-axis direction in FIG. 9) and spaced away from one another.

Each of the plurality of flat cables 10E includes a first end 31, a second end 32, and a third end 33. The corresponding flat cable 10E includes a connector 13 at the first end 31 and a connector 13 at the second end 32 that are connected to each other by a plurality of signal conductors. The corresponding flat cable 10E includes a connector 13 at the third end 33 that is connected to the connector 13 at the first end 31 by the plurality of signal conductors.

Each of the plurality of flat cables 10E includes bent portions CV at a middle position of the plurality of signal conductors in a direction where the plurality of signal conductors extend. Each of the bent portions CV is shaped in accordance with a shape of the corresponding circuit boards 91.

The features described above provide advantageous effects the same as or similar to those described in each of the foregoing preferred embodiments.

Sixth Preferred Embodiment

Figure 10:
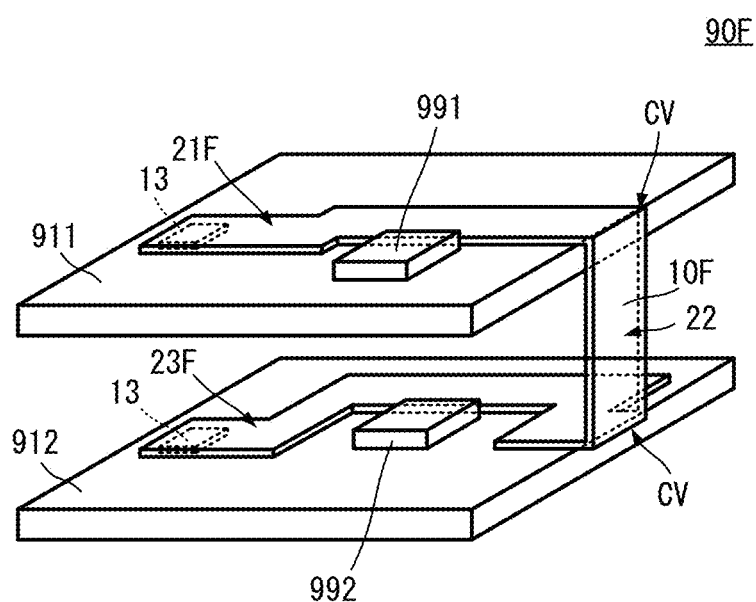
FIG. 10 is an external perspective view showing an electronic device according to a sixth preferred embodiment of the present invention.

An electronic device according to a sixth preferred embodiment of the present invention will be described with reference to the drawings. FIG. 10 is an external perspective view showing the electronic device according to the sixth preferred embodiment of the present invention.

As shown in FIG. 10, an electronic device 90F according to the sixth preferred embodiment includes a flat cable 10F having a shape different from that in the electronic device 90 according to the first preferred embodiment, and the flat cable 10E has a different connection to a circuit board 911 and a circuit board 912 that in the electronic device 90 according to the first preferred embodiment. Other features in the electronic device 90F are the same as or similar to those in the electronic device 90, and thus a detailed description thereof will be omitted.

The circuit board 911 and the circuit board 912 have the same or substantially the same external shape. The circuit board 911 includes an electronic component 991 mounted thereon, and the circuit board 912 includes an electronic component 992 mounted thereon. However, the electronic component 991 is mounted on the circuit board 911 at a position different from a position where the electronic component 992 is mounted on the circuit board 912.

The flat cable 10F includes a first section 21F, a second section 22, and a third section 23F. The first section 21F has a shape (an external shape in plan view) different from a shape (an external shape in plan view) that the third section 23F has. The first section 21F is shaped to avoid the electronic component 991 when the flat cable 10F is connected to the circuit board 911. The third section 23F is shaped to avoid the electronic component 992 when the flat cable 10F is connected to the circuit board 912.

Even when the electronic device 90F includes the circuit board 911 and the circuit board 912, each including a corresponding component that is differently mounted from the other (for example, the position and the size), the circuit board 911 and the circuit board 912 are connected by the flat cable 10F.

In each of the foregoing preferred embodiments, the flat cable does not include a ground conductor, but includes the plurality of signal conductors, each transmitting a single signal. However, the present invention is not limited thereto, and a flat cable may include features to transmit a signal as described below, for example. Each of FIGS. 11A to 11D are cross-sectional views showing an example of the flat cable. Each of FIGS. 11A to 11D show cross-sectional views of a second section, and a transmission line in each of a first section and a third section is the same as or similar to that in the second section.

Figure 11A:
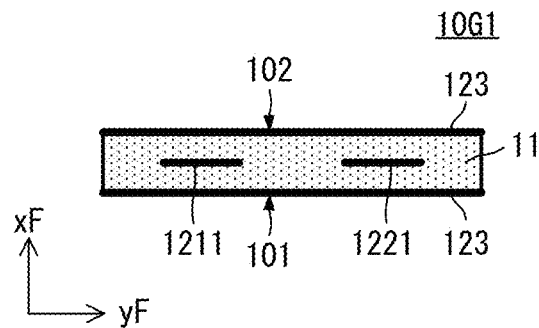
FIGS. 11A to 11D are cross-sectional views showing an example of a flat cable.

In FIG. 11A, a substrate 11 includes two signal conductors, that is, a signal conductor 1211 and a signal conductor 1221 included therein. The signal conductor 1211 and the signal conductor 1221 are parallel or substantially parallel to each other. The substrate 11 includes a ground conductor 123 provided on a first main surface 101 and on a second main surface 102. The ground conductor 123 opposes the signal conductors 1211 and 1221, and preferably covers an entire or substantially an entire surface of the first main surface 101 and an entire or substantially an entire surface of the second main surface 102, for example.

Accordingly, in a flat cable 10G1, a differential signal transmission line of strip-line structure is provided.

Figure 11B:
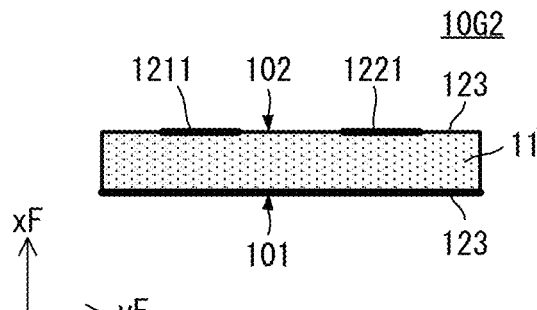

In FIG. 11B, the substrate 11 includes two signal conductors, that is, the signal conductor 1211 and the signal conductor 1221 provided on the second main surface 102. The signal conductor 1211 and the signal conductor 1221 are parallel or substantially parallel to each other. The substrate 11 includes the ground conductor 123 provided on the first main surface 101. The ground conductor 123 opposes the signal conductors 1211 and 1221, and preferably covers the entire or substantially the entire surface of the first main surface 101, for example.

Accordingly, in a flat cable 10G2, a differential signal transmission line of micro strip-line structure is provided.

Figure 11C:
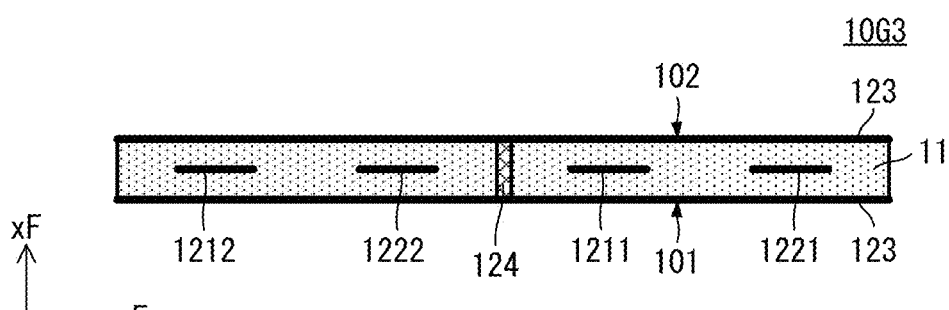

In FIG. 11C, the substrate 11 includes four signal conductors, that is, the signal conductor 1211, the signal conductor 1221, a signal conductor 1212, and a signal conductor 1222 included therein. The signal conductor 1211, the signal conductor 1221, the signal conductor 1212, and the signal conductor 1222 are parallel or substantially parallel to one another. The substrate 11 includes a ground conductor 123 provided on a first main surface 101 and on a second main surface 102. The ground conductor 123 opposes the signal conductors 1211, 1221, 1212, and 1222, and preferably covers the entire or substantially the entire surface of the first main surface 101 and the entire or substantially the entire surface of the second main surface 102, for example. The substrate 11 includes an interlayer connection conductor 124 located at a middle position of the substrate 11 in a direction where the plurality of signal conductors, that is, the signal conductors 1211, 1221, 1212, and 1222 are provided and aligned. The interlayer connection conductor 124 is provided between a set of the signal conductors 1211 and 1221 and a set of the signal conductors 1212 and 1222. The interlayer connection conductor 124 is connected to the ground conductor 123 on the first main surface 101 and to the ground conductor 123 on the second main surface 102. The interlayer connection conductor 124 is defined by, for example, through-hole plating or a conductive paste via.

Accordingly, in a flat cable 10G3, two sets of differential signal transmission lines of strip-line structure are provided. In the flat cable 10G3, between the two sets of differential signal transmission lines, the interlayer connection conductor 124 is provided and connected to the ground conductors 123. Accordingly, electromagnetic field coupling between the differential signal transmission line defined by the signal conductors 1211 and 1221 and the differential signal transmission line defined by the signal conductors 1212 and 1222 is able to be significantly reduced or prevented, thus significantly improving isolation of these differential signal transmission lines. In other words, an electromagnetic shield is able to be provided between the plurality of the differential signal transmission lines.

Figure 11D:
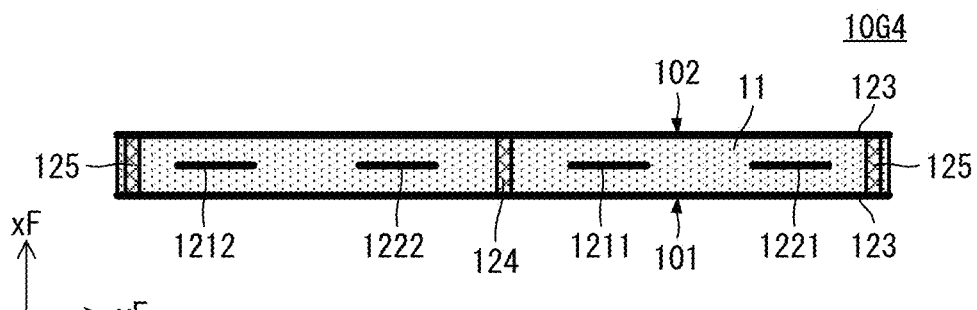

In FIG. 11D, unlike FIG. 11C, the substrate 11 additionally includes an interlayer connection conductor 125. The interlayer connection conductor 125 is provided at each end of the substrate 11 in the direction in which the signal conductors 1211, 1221, 1212, and 1222 are provided and aligned.

Accordingly, in a flat cable 10G4, two sets of differential signal transmission lines of strip-line structure are provided, and concurrently, the two sets of differential signal transmission lines are respectively electromagnetic field shielded.

With these differential signal transmission lines, the number of the signal conductors is increased, and the signal conductors in each pair to transmit the differential signals are required to be provided at a constant or substantially constant distance from each other. Thus, with a conventional configuration, complications in the structure of the signal conductors arise. On the other hand, with the features of preferred embodiments of the present invention, the complications are able to be significantly reduced or prevented.

In each of the foregoing preferred embodiments, a flat cable includes a plurality of signal conductors, but even when the flat cable includes only a single signal conductor, advantageous effects similar to those described above are able to be provided. Further, the respective structures and features in each of the foregoing preferred embodiments may be combined as appropriate within the technical range of the present invention, thus resulting in advantageous effects of the combination.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic device comprising:
   a plurality of circuit boards having a same or substantially same shape; and
   a plurality of flat cables having a same or substantially same shape; wherein
   the plurality of circuit boards are in a predetermined arrangement and are connected to one another by the plurality of flat cables;
   each of the plurality of flat cables is a semi-rigid cable and has a shape in accordance with the predetermined arrangement of the plurality of circuit boards;
   each of the plurality of flat cables includes a substrate including a thicker portion and a portion other than the thicker portion, the thicker portion being thicker than the portion other than the thicker portion;
   in the substrate, a recessed portion is defined by a gap between a thickness of the thicker portion and a thickness of the portion other than the thicker portion; and
   each of the plurality of circuit boards is inserted into the recessed portion.

2. The electronic device according to claim 1, wherein each of the plurality of flat cables includes a substrate including an insulator layer that is thermoplastic; and
   the substrate is plastically deformed to define the shape of the plurality of flat cables which is in accordance with the predetermined arrangement of the plurality of circuit boards.

3. The electronic device according to claim 2, wherein the substrate includes a first end and a second end; and
   the substrate includes a signal conductor having a linear shape, the signal conductor extending between the first end and the second end.

4. The electronic device according to claim 3, wherein at each side of the substrate in a direction orthogonal or substantially orthogonal to a direction in which the signal conductor extends, a magnetic filler is provided; and
   in the substrate, when viewed in the direction orthogonal or substantially orthogonal to the direction in which the signal conductor extends, a thickness of a portion where the magnetic filler is provided is greater than a thickness of a portion where the magnetic filler is not provided.

5. The electronic device according to claim 4, wherein the thicker portion includes the portion where the magnetic filler is provided and the portion other than the thicker portion includes the portion where the magnetic filler is not provided.

6. The electronic device according to claim 3, wherein the substrate includes a circuit function unit that is connected to the signal conductor or that uses the signal conductor.

7. The electronic device according to claim 6, wherein at each side of the circuit function unit in a direction orthogonal or substantially orthogonal to a direction in which the signal conductor extends, a magnetic filler is provided.

8. The electronic device according to claim 6, wherein the circuit function unit defines a noise removal circuit to remove a noise directed to a signal flowing through the signal conductor.

9. The electronic device according to claim 6, wherein, in the substrate, a thickness of the circuit function unit is greater than a thickness of a portion other than the circuit function unit.

10. The electronic device according to claim 9, wherein with respect to the portion other than the circuit function unit, the circuit function unit projects beyond a first main surface and is aligned on a second main surface.

11. The electronic device according to claim 9, wherein the thicker portion includes the circuit function unit and the portion other than the thicker portion includes the portion other than the circuit function unit.

12. The electronic device according to claim 11, wherein the recessed portion has a same or substantially a same shape as an external shape of each of the plurality of circuit boards.

13. The electronic device according to claim 1, wherein each of the plurality of flat cables includes a substrate including a plurality of insulator layers that are laminated, and each of the plurality of insulator layers being thermoplastic;
   the plurality of insulator layers includes a first insulator layer having a first length in a specific direction, and a second insulator layer having a second length in the specific direction;
   the first length is greater than the second length; and
   the first insulator layer and the second insulator layer are laminated on each other in a direction orthogonal or substantially orthogonal to the specific direction, in order to define the shape of the plurality of flat cables which is in accordance with the predetermined arrangement of the plurality of circuit boards.

14. A flat cable to connect a first board and a second board that are aligned in a specific direction and include surfaces opposing one another in the specific direction, the flat cable comprising:

a linear section extending in the specific direction; and
two connection sections, each extending in a direction other than the specific direction; wherein
one of the two connection sections is connected to the first board and another of the two connection sections is connected to the second board;
the two connection sections overlap each other when viewed in the specific direction;
the linear section includes a thicker portion and a portion other than the thicker portion, the thicker portion being thicker than the portion other than the thicker portion;
in the linear section, a recessed portion is defined by a gap between a thickness of the thicker portion and a thickness of the portion other than the thicker portion; and
the first board or the second board is inserted into the recessed portion.

15. The flat cable according to claim 14, wherein each of the two connection sections extends in a direction perpendicular or substantially perpendicular to the specific direction.

16. The flat cable according to claim 14, wherein
the thicker portion includes a projecting portion that projects in a direction perpendicular or substantially perpendicular to the specific direction; and
at each side of the projecting portion in the direction perpendicular or substantially perpendicular to the specific direction, a magnetic filler is provided.

17. The flat cable according to claim 16, wherein
in the linear section, the gap is provided by a thickness of the projecting portion and the thickness of the portion other than the thicker portion.

18. The flat cable according to claim 14, wherein at least one of the two connection sections is connected to the first board without a connector, or is connected to the second board without the connector.

19. The flat cable according to claim 18, wherein
the connector is connected to at least one of the two connection sections; and
the connector is inserted to be fitted into a connector of the first board or a connector of the second board in a direction perpendicular or substantially perpendicular to the specific direction.

20. The flat cable according to claim 14, wherein the linear section has a shape corresponding to a shape of a space between the first board and the second board.

21. The flat cable according to claim 14, wherein the linear section includes a differential signal transmission line including a plurality of signal conductors that are parallel or substantially parallel to one another.

22. The flat cable according to claim 21, wherein
a plurality of sets of the differential signal transmission lines are included; and
an electromagnetic shield is provided between each of the plurality of sets of differential signal transmission lines.

23. The flat cable according to claim 14, wherein
the one of the two connection sections that is connected to the first board has a shape in accordance with other components mounted on the first board; and
the another of the two connection sections that is connected to the second board has a shape in accordance with other components mounted on the second board.

24. A flat cable to connect a first board and a second board that are aligned in a specific direction and include surfaces opposing one another in the specific direction, the flat cable comprising:
a connection section to be connected to the first board;
a connection section to be connected to the second board; and
a linear section provided between the connection section to be connected to the first board and the connection section to be connected to the second board; wherein
the linear section has a shape corresponding to a shape between the first board and the second board;
the linear section includes a thicker portion and a portion other than the thicker portion, the thicker portion being thicker than the portion other than the thicker portion;
in the linear section, a recessed portion is defined by a gap between a thickness of the thicker portion and a thickness of the portion other than the thicker portion; and
the first board or the second board is inserted into the recessed portion.

25. The flat cable according to claim 24, wherein
the thicker portion includes a projecting portion that projects in a direction perpendicular or substantially perpendicular to the specific direction; and
at each side of the projecting portion in the direction perpendicular or substantially perpendicular to the specific direction, a magnetic filler is provided.

26. The flat cable according to claim 25, wherein
in the linear section, the gap is provided by thickness of the projecting portion and the thickness of the portion other than the thicker portion.

* * * * *